US009062811B2

(12) United States Patent
Yu (10) Patent No.: US 9,062,811 B2
(45) Date of Patent: Jun. 23, 2015

(54) SUPPORT STRUCTURE AND ELECTRONIC DEVICE USING SAME (71) Applicants: Fu Tai Hua Industry (Shenzhen) Co., Ltd., Shenzhen (CN); HON HAI PRECISION INDUSTRY CO., LTD., New Taipei (TW)

(72) Inventor: Wen-Hua Yu, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 303 days.

(21) Appl. No.: 13/713,144

(22) Filed: Dec. 13, 2012

(65) Prior Publication Data

US 2013/0155586 A1 Jun. 20, 2013

(30) Foreign Application Priority Data

Dec. 15, 2011 (CN) .......................... 2011 1 0420242

(51) Int. Cl.
H05K 7/00 (2006.01)
F16M 11/00 (2006.01)
H05K 7/18 (2006.01)
F16M 11/14 (2006.01)
F16M 11/20 (2006.01)

(52) U.S. Cl.
CPC ................. *F16M 11/00* (2013.01); *H05K 7/18* (2013.01); *F16M 11/14* (2013.01); *F16M 11/2021* (2013.01); *F16M 2200/022* (2013.01)

(58) Field of Classification Search
CPC ...... F16M 11/2021; F16M 11/00; H05K 7/18
USPC ...................... 248/688, 458, 477, 288.51, 921
See application file for complete search history.

(56) References Cited

U.S. PATENT DOCUMENTS

| | | | |
|---|---|---|---|
| 6,347,776 B1 * | 2/2002 | Chuang | 248/288.51 |
| 7,380,759 B1 * | 6/2008 | Whiteside et al. | 248/183.1 |
| 7,387,284 B2 * | 6/2008 | Chang | 248/206.5 |
| 7,475,858 B2 * | 1/2009 | Kalis et al. | 248/288.31 |
| 7,661,648 B2 * | 2/2010 | Lin | 248/683 |
| 7,695,170 B1 * | 4/2010 | Baldwin et al. | 362/371 |
| D645,033 S * | 9/2011 | Quong et al. | D14/253 |
| 8,235,334 B1 * | 8/2012 | Kobal | 248/122.1 |
| D682,281 S * | 5/2013 | Barnard et al. | D14/447 |
| 8,487,169 B2 * | 7/2013 | Dunlop | 84/329 |
| 8,511,625 B2 * | 8/2013 | Stefan et al. | 248/181.1 |
| 8,910,914 B2 * | 12/2014 | Bigeh | 248/288.31 |
| 2005/0127261 A1 * | 6/2005 | Lin | 248/288.51 |
| 2006/0145043 A1 * | 7/2006 | Liou et al. | 248/324 |
| 2007/0034753 A1 * | 2/2007 | Lee | 248/121 |
| 2008/0197250 A1 * | 8/2008 | Kaneda et al. | 248/206.3 |
| 2011/0095159 A1 * | 4/2011 | Carnevali | 248/372.1 |

(Continued)

*Primary Examiner* — David M Sinclair
*Assistant Examiner* — Robert Brown
(74) *Attorney, Agent, or Firm* — Novak Druce Connolly Bove + Quigg LLP (57) ABSTRACT

An inbuilt support structure for holding an electronic device includes a stand and a holding mechanism. The stand includes a support body and a shaft. The shaft is connected to a first end of the support body. The holding mechanism includes a holding portion and a connecting portion. The connecting portion is positioned on the holding portion and receives the shaft. The holding portion holds the electronic device. A second end of the support body rests stably on an external surface so as to support the electronic device when being viewed.

20 Claims, 7 Drawing Sheets

(56) References Cited

U.S. PATENT DOCUMENTS

| | | |
|---|---|---|
| 2012/0170212 A1* | 7/2012 | Gallouzi et al. .......... 361/679.56 |
| 2012/0175474 A1* | 7/2012 | Barnard et al. ............ 248/122.1 |
| 2012/0241567 A1* | 9/2012 | Gillespie-Brown et al. .......................... 248/122.1 |
| 2012/0318937 A1* | 12/2012 | Carnevali ................... 248/122.1 |
| 2013/0009032 A1* | 1/2013 | Polletta et al. ............. 248/440.1 |
| 2013/0026324 A1* | 1/2013 | Fischer et al. ............. 248/316.1 |
| 2013/0126688 A1* | 5/2013 | Li et al. ...................... 248/276.1 |
| 2013/0134284 A1* | 5/2013 | Hu et al. ....................... 248/451 |
| 2013/0140413 A1* | 6/2013 | Bailey ........................... 248/201 |
| 2014/0168890 A1* | 6/2014 | Barnard ................... 361/679.55 |
| 2014/0198433 A1* | 7/2014 | Chang et al. ............. 361/679.01 |
| 2014/0203156 A1* | 7/2014 | Stener ........................... 248/425 |

\* cited by examiner

SUPPORT STRUCTURE AND ELECTRONIC DEVICE USING SAME

BACKGROUND

1. Technical Field

The present disclosure relates to a support structure, and an electronic device using the support structure for support.

2. Description of Related Art

Many electronic devices have no self-support structures, and need to be held by hand. However, a user may become fatigued when holding an electronic device for a long time, such as when the user is watching a film on the electronic device.

What is needed, therefore, is a support structure and an electronic device using the support structure for support, which can overcome the aforementioned problems.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the various views.

DETAILED DESCRIPTION

Reference will be made to the drawings to describe specific exemplary embodiments of the present disclosure.

Referring to FIGS. 1-5, an electronic device 100 of one embodiment of the present disclosure includes a main body 99 and a support structure 11. The main body 99 may be a tablet computer, an electronic book, a cellular phone, or a game console for example, and has a display screen. The support structure 11 supports the main body 99 on an external surface 200 (see FIG. 1). The external surface 200 may be a tabletop or a desktop, for example. The main body 99 is rotatable around the support structure 11.

The support structure 11 includes a holding mechanism 21 and a stand 31. The holding mechanism 21 holds the main body 99, and is rotatably connected to the stand 31. The holding mechanism 21 can be rotated around the stand 31 from a 0° position to 90°, 180°, and 270° positions, clockwise or counterclockwise, so that the holding mechanism 21 is capable of switching among four selectable orientations.

The stand 31 includes a support body 33, a shaft 35, and two pivots 38. The support body 33 includes a first end 338 and a second end 339. The first end 338 mounts the holding mechanism 21, and the second end 339 contacts the external surface 200. The shaft 35 is connected to the first end 338, and protrudes from the first end 338. Further, the shaft 35 is connected to the holding mechanism 21 such that the holding mechanism 21 is rotatable about the shaft 35. The shaft 35 includes a pair of shaft housings 37. The first end 338 includes a plurality of shaft holes 36. The pivots 38 extend through the shaft holes 36 and the shaft housings 37, and thus the support body 33 and the shaft 35 are hinged together. In the present embodiment, the shaft 35 may be a universal shaft, for example.

Figure 1:
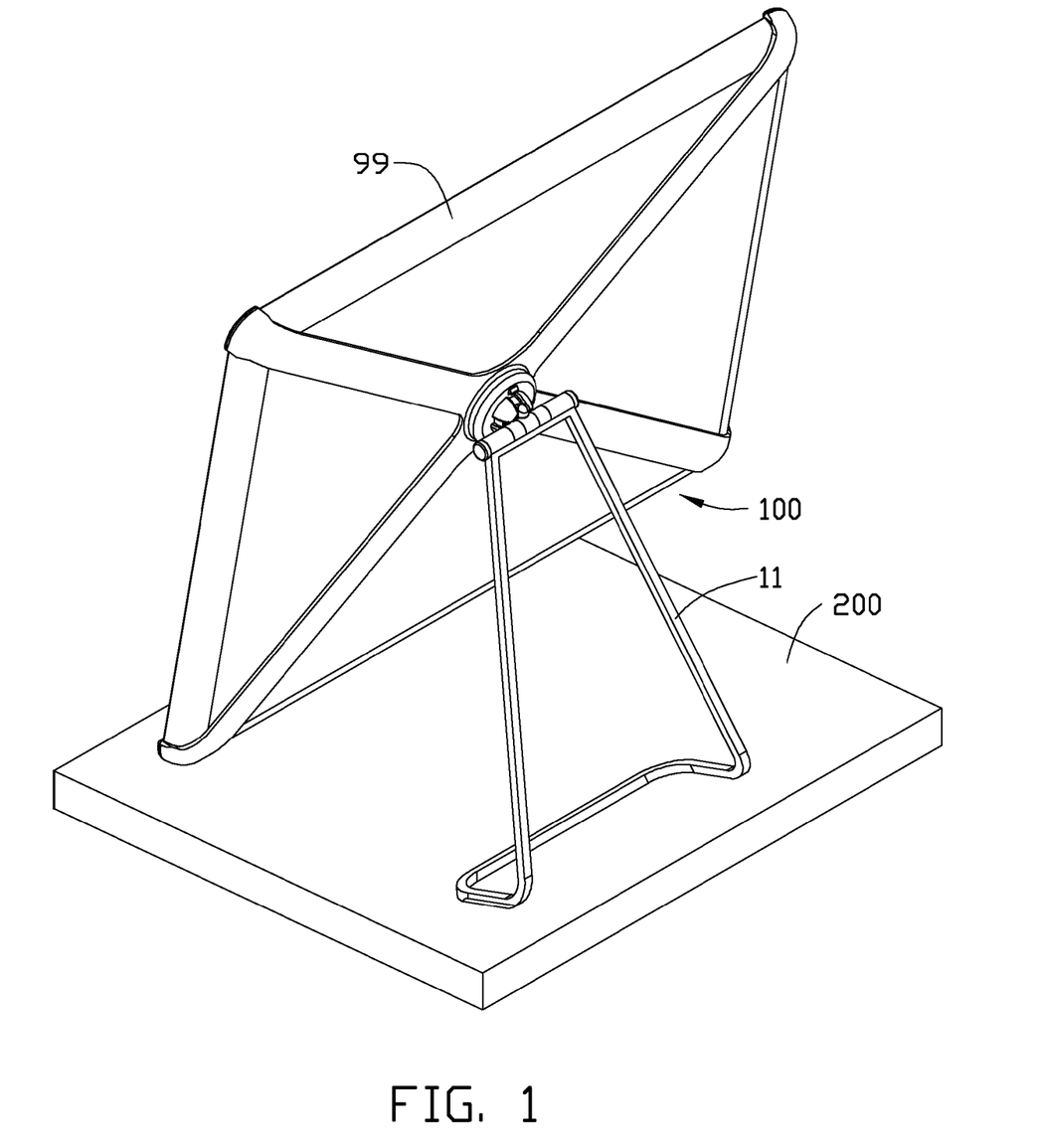
FIG. 1 is a rear isometric view of one embodiment of a support structure supporting a main body of an electronic device on an external surface.
Figure 2:
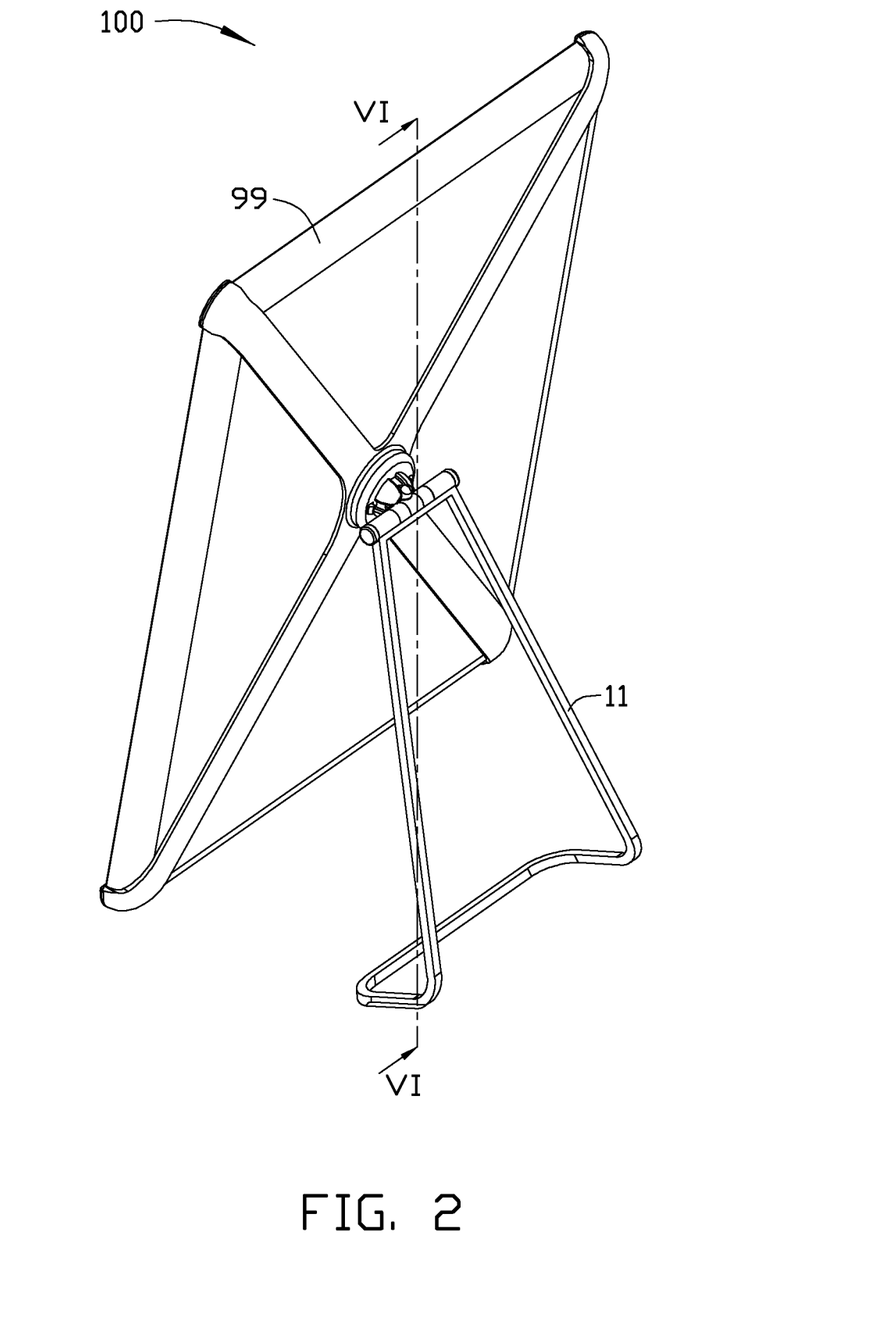
FIG. 2 is similar to FIG. 1, but showing the main body rotated 90° from its position in FIG. 1.
Figure 3:
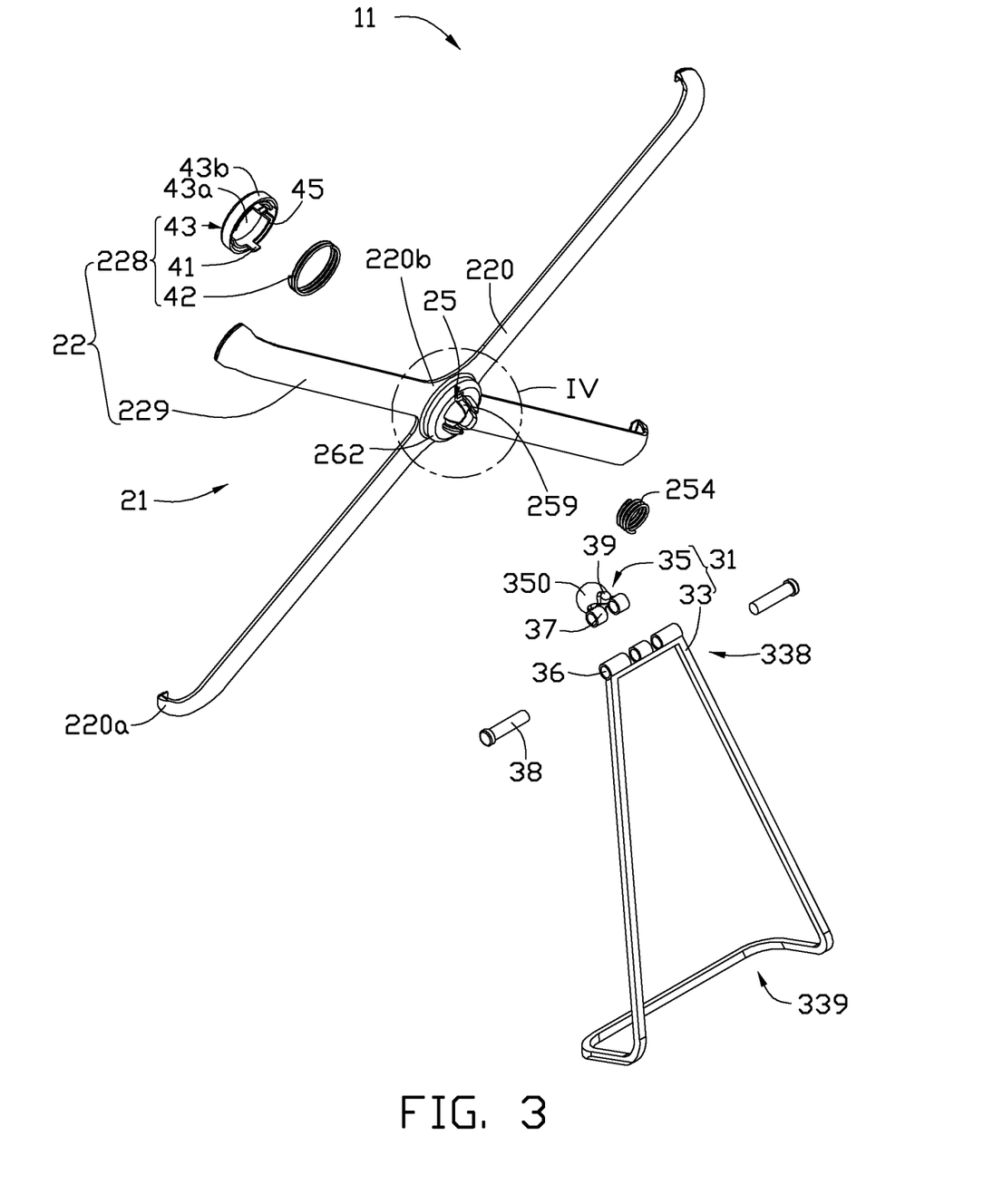
FIG. 3 is an exploded, isometric view of the support structure of FIG. 1.
Figure 4:
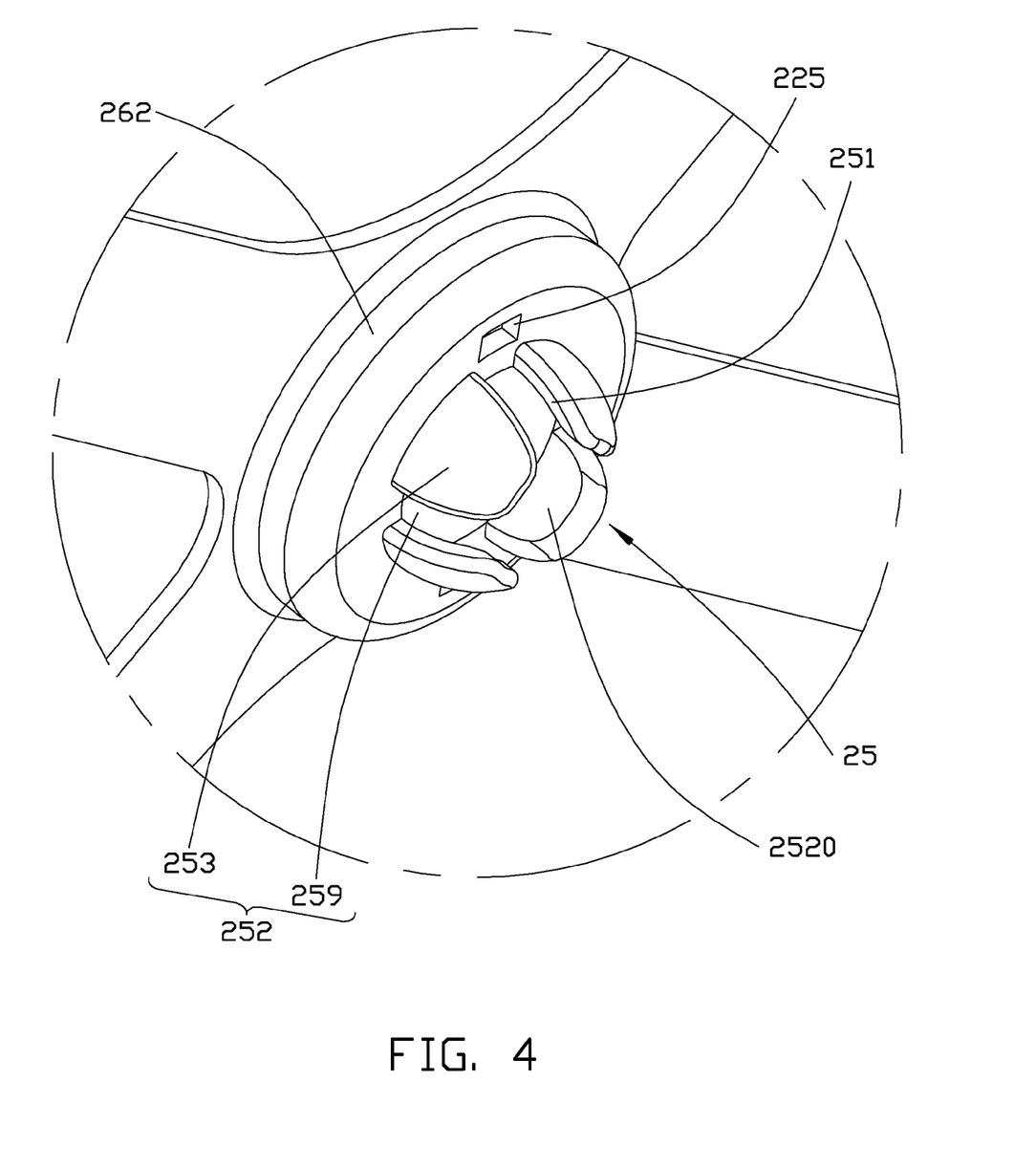
FIG. 4 is an enlarged view of a circled part IV of FIG. 3.
Figure 5:
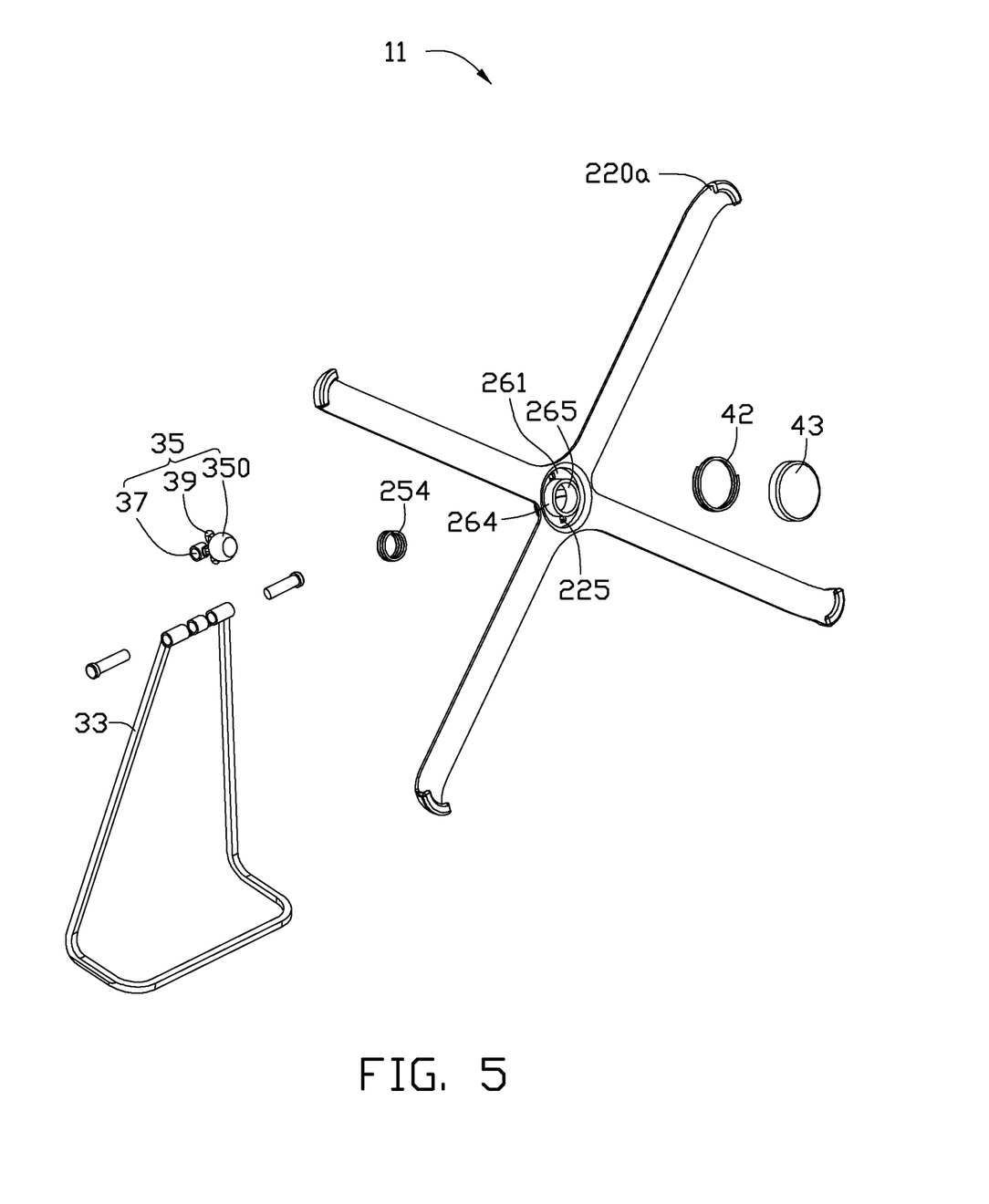
FIG. 5 is an isometric view of the support structure of FIG. 3 viewed from another angle.

The shaft 35 includes a shaft body 350, two position-limiting elements 39, and the shaft housings 37. The two position-limiting elements 39 are positioned on the same (rear) side of the shaft body 350 and are located between the shaft body 350 and the shaft housings 37. The two position-limiting elements 39 are opposite to each other, and coaxial with each other. The position-limiting elements 39 may each be a protrusion positioned on a rear side of the shaft body 350. The shaft body 350 may be a universal ball, or a segment of a sphere, for example, as best seen in FIG. 5. The position-limiting elements 39 hold the main body 99 stably once the holding mechanism 21 has been rotated to a selected one of the four orientations.

The holding mechanism 21 includes a holding portion 22 and a connecting portion 25. The holding portion 22 is generally at a front side of the holding mechanism 21, and holds the main body 99. In the present embodiment, the holding portion 22 and the stand 31 both rest on the external surface 200, and thereby cooperatively support the main body 99 just above the external surface 200. The connecting portion 25 is positioned on a back side of the holding portion 22. The connecting portion 25 receives the shaft body 350 such that the connecting portion 25 is rotatable about the shaft body 350. The holding portion 22 holds the main body 99 stably at each of the four orientations by the cooperation of the connecting portion 25 and the position-limiting elements 39.

The holding portion 22 includes a holding bracket 229 and a resisting part 228. The holding bracket 229 includes two crossing holding bars 220. Each holding bar 220 includes two opposite free ends 220a. In the present embodiment, each free end 220a is in the form of a hook. The four free ends 220a of the holding bracket 229 hook and hold four corners of the main body 99. The resisting part 228 resiliently holds a middle portion of a rear side of the main body 99, as is described in more detail below. Thus, the four free ends 220a of the holding bracket 229 and the resisting part 228 cooperatively hold the main body 99.

The resisting part 228 includes a pair of hooking elements 41, an elastic element 42, and a resisting element 43. The elastic element 42 is positioned between the resisting element 43 and the holding bracket 229, so as to elastically resist the resisting element 43. The resisting element 43 resists the main body 99 due to the elastic element 42 being compressed and thereby urging the resisting element 43. The elastic element 42 and the resisting element 43 are detachably fixed to the holding bracket 229 by the hooking elements 41. In the present embodiment, the resisting element 43 may be a lid or cap, for example. The resisting element 43 includes a main plate 43a and an extending part 43b extending from an outer peripheral edge of the main plate 43a. For example, the extending part 43b may be annular. The hooking elements 41 extend from the resisting element 43 and can be considered to be surrounded by the extending part 43b. The hooking elements 41 extend farther than the extending part 43b along a direction away from the main plate 43a. The hooking elements 41 and the resisting element 43 cooperatively define a first receiving space 45. Each hooking element 41 may be a hook. The elastic element 42 may be a coil spring. A pair of opposite locking members 225 is positioned corresponding to a crossing portion 220b of the two crossing bars 220. Each locking member 225 may include a through hole. The hooking elements 41 are inserted into and engaged in the locking members 225.

The connecting portion 25 includes a plurality of position-limiting slots 251 and a receiving part 252. In the present embodiment, there are four position-limiting slots 251. Two of the four position-limiting slots 251 are opposite to each other, and the other two position-limiting slots 251 are opposite to each other, with the locations of the four position-limiting slots 251 creating location angles of 0°, 90°, 180°, and 270°. The receiving part 252 receives the shaft body 350. The position-limiting elements 39 cooperate with the position-limiting slots 251, so as to limit the shaft body 350 in the connection portion 25 and restrict the holding portion 22 to any given one of the four orientations.

The receiving part 252 includes a plurality of sidewalls 253 extending from the crossing portion 220b, and a second receiving space 259 cooperatively surrounded by the plurality of sidewalls 253. In the present embodiment, there are four sidewalls 253. The sidewalls 253 each have a curved surface coinciding with the surface of a single common imaginary sphere, and distal portions of the four sidewalls 253 cooperatively define an opening 2520 of the second receiving space 259. The sidewalls 253 are elastic, and a size of the opening 2520 is a little less than the largest cross section of the shaft body 350, when the sidewalls 253 are not deformed. The shaft body 350 is inserted into the receiving part 252 through the opening 2520. The sidewalls 253 are spaced apart from each other. Every two adjacent sidewalls 253 define a corresponding one of the position-limiting slots 251 therebetween. The two position-limiting elements 39 are received in two selected opposite position-limiting slots 252 when the main body 99 is placed on the external surface 200 in a landscape orientation or in a portrait orientation.

In order to keep the shaft body 350 and the receiving part 252 fitting tightly together, substantial friction forces exist between the shaft body 350 and an inside surface of each sidewall 253, and/or an elastic fastening element 254 can be positioned in the receiving part 252 to enhance friction. The elastic fastening element 254 is resiliently held between the shaft body 350 and a rear surface of the main plate 43a of the resisting element 43. In the present embodiment, the elastic fastening element 254 is a coil spring.

The resisting part 228 and the connecting portion 25 are mounted on opposite sides of the crossing portion 220b. A central part of the crossing portion 220b protrudes towards the side of the holding portion 22 opposite to the side of the holding portion 22 holding the main body 99, and thus the central part of the crossing portion 220b forms a protrusion 262. The connection portion 25 is positioned on the protrusion 262. Further, the protrusion 262 defines a third receiving space 261, which has an opening facing towards the side of the holding portion 22 holding the main body 99. A ring 264 is formed in the third receiving space 261. The two locking members 225 are formed on the protrusion 262, and are located at outsides of the sidewalls 253 and the ring 264. The hooking elements 41 and the elastic element 42 are received in the third receiving space 261. The hooking elements 41 are inserted into and engaged with the locking members 225. The elastic element 42 is positioned between the hooking elements 41 and the ring 264. The ring 264 defines a fourth receiving space 265 therein, with the fourth receiving space 265 communicating with the second receiving space 259. The fourth receiving space 265 and the second receiving space 259 cooperatively receive the shaft body 350 and the elastic fastening element 254.

Figure 6:
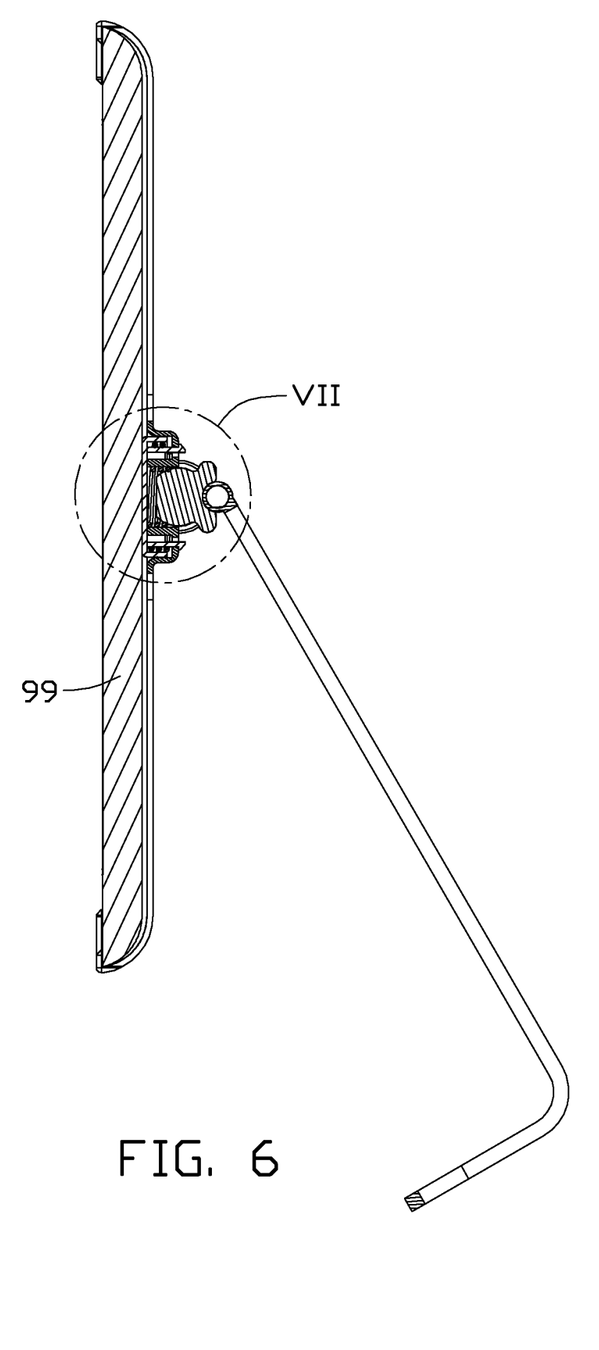
FIG. 6 is a cross-sectional view of a portion of the support structure and the electronic device, taken along a line VI-VI of FIG. 2.
Figure 7:
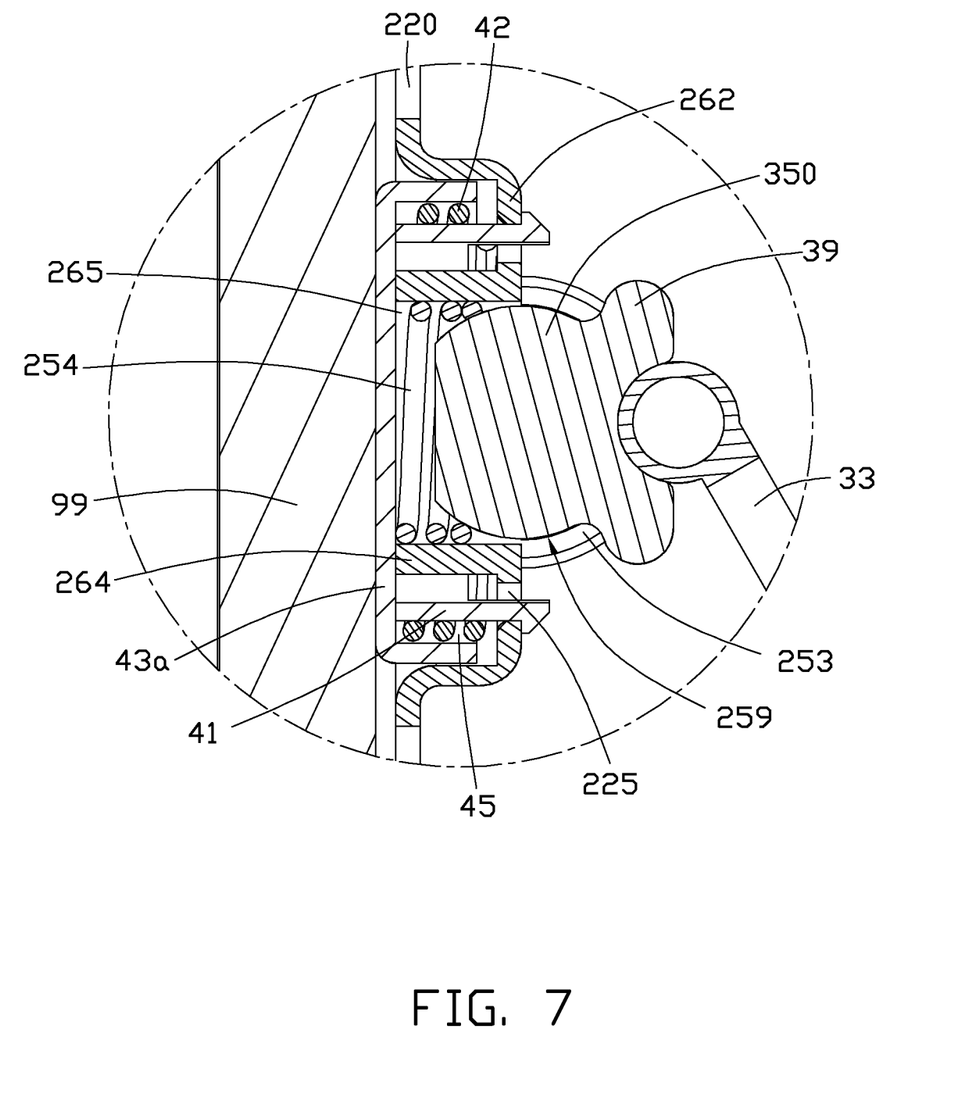
FIG. 7 is an enlarged view of a circled part VII of FIG. 6.

Referring to FIGS. 6-7, a process of assembly of the supporting structure 11 is as follows.

The elastic fastening element 254 is received in the receiving part 252, and then the shaft body 350 is received in the receiving part 252 through the opening 2520. The fourth receiving space 265 and the second receiving space 259 cooperatively receive the elastic fastening element 254 and the shaft body 350. The elastic element 42 is sleeved over the ring 264. The hooking elements 41 are inserted into the locking members 225, and thus the resisting part 228 is fixed on the holding bracket 229. The shaft 35 and the support body 33 are hinged together. The position-limiting elements 39 are received in two selected opposite position-limiting slots 251, depending on which orientation of the main body 99 is required.

In use of the supporting structure 11, the holding bracket 229 hooks and holds the four corners of the main body 99, and the resisting element 43 resiliently resists against the main body 99 under the urging of the elastic element 42. Accordingly, the main body 99 is firmly held by the supporting structure 11. The main body 99 is supported above the external surface 200 by the cooperation of the stand 31 and the holding bracket 229. When an orientation of the main body 99 is to be changed from a landscape orientation (FIG. 1) to a portrait orientation (FIG. 2) for example, the main body 99 is rotated by a user. As a result, the position-limiting elements 39 are released from the position-limiting slots 251, and the connecting portion 25 is rotated around the shaft body 350. When the main body 99 reaches the portrait orientation, the position-limiting elements 39 are received in the other two position-limiting slots 251. An angle of elevation of the main body 99 can be adjusted by controlling the depth to which the position-limiting elements 39 are received in the two position-limiting slots 251. In addition, the angle of elevation of the main body 99 is further adjustable via rotation of the shaft housings 37 around the pivots 38.

Since the main body 99 of the electronic device 100 employing the supporting structure 11 is supported entirely by the supporting structure 11, the user can enjoy the electronic device 100 hands-free. For example, the user can comfortably watch a film shown on the display screen of the main body 99 of the electronic device 100. Further, because the holding mechanism 21 is rotatable around the stand 31, the orientation of the main body 99 can be adjusted. Thus the electronic device 100 can provide orientations which are appropriate for the display content being viewed by the user.

In alternative embodiments, the resisting element 43 can be omitted. In such cases, the elastic element 42 and the holding bracket 229 cooperatively fix the main body 99.

In other alternative embodiments, only the stand 31 rests on the external surface 200, and the stand 31 thereby supports the main body 99 just above the external surface 200. In such case, the stand 31 is suitably shaped to solely hold the weight of the main body 99.

It is believed that the present embodiments and their advantages will be understood from the foregoing description, and it will be apparent that various changes may be made thereto without departing from the spirit and scope of the embodiments or sacrificing all of their material advantages.

What is claimed is:

1. A support structure for holding an electronic device, the support structure comprising:

a stand, comprising a support body, a shaft, and a first position-limiting element, the shaft connected to a first end of the support body; and a holding mechanism, comprising:
  a holding portion configured to hold at least a portion of the electronic device; and
  a connecting portion positioned on the holding portion, and receiving the shaft and being rotatable around the shaft, the connecting portion comprising at least two position-limiting slots;
wherein a second end of the support body is configured to rest on an external surface so as to support the electronic device above the external surface, the connecting portion is rotatable in unison with rotation of the holding portion, with the connecting portion thereby rotating around the shaft, and the connecting portion stops rotating around the shaft when the first position-limiting element reaches and is received and engaged in one of the at least two position-limiting slots.

2. The support structure of claim 1, wherein the holding portion holds the electronic device in different predetermined orientations stably when the first position-limiting element is received in and engaged in different position-limiting slots, the shaft comprises a shaft body and at least one shaft housing, the first position-limiting element is positioned between the shaft body and the at least one shaft housing, the first position-limiting element and the shaft body protrude from the at least one shaft housing, the shaft body is received in the connecting portion with the connecting portion rotatably around the shaft body, and the at least one shaft housing is connected to the first end of the support body.

3. The support structure of claim 2, further comprising at least one pivot, wherein the first end of the stand comprises a plurality of shaft holes, the at least one pivot extends through the plurality of shaft holes and the at least one shaft housing, and thus the support body and the shaft are hinged together.

4. The support structure of claim 3, further comprising an elastic fastening element, wherein the elastic fastening element is received in the connecting portion and is resiliently held between the shaft body and the holding portion thereby resiliently holding the shaft body in contact with the connecting portion.

5. The support structure of claim 4, wherein the holding mechanism comprises a holding bracket and a resisting part, the holding bracket comprises two crossing holding bars, each holding bar comprises two opposite free ends, each free end is in the form of a hook, the four free ends of the holding bracket are configured to hook and hold four corners of the electronic device, and the resisting part is configured to resiliently hold a middle portion of a rear side of the electronic device.

6. The support structure of claim 5, wherein the resisting part and the connecting portion are positioned on two opposite sides of the holding portion, and the resisting part comprises an elastic element configured to resiliently urge the electronic device.

7. The support structure of claim 6, wherein the holding mechanism further comprises at least one locking member positioned on the holding portion, the resisting part further comprises a resisting element and at least one hooking element, the at least one hooking element is positioned on the resisting element, the resisting element and the at least one hooking element cooperatively define a first receiving space therebetween, the at least one hooking element is inserted into and engaged with the at least one locking member, the elastic element is received in the first receiving space, and the resisting element resiliently holds the middle portion of the rear side of the electronic device under the urging of the elastic element.

8. The support structure of claim 7, wherein the connecting portion further comprises a receiving part comprising a plurality of sidewalls and a second receiving space cooperatively surrounded by the plurality of sidewalls, the sidewalls each have a curved surface coinciding with the surface of a single common imaginary sphere, adjacent end portions of the sidewalls cooperatively define an opening of the second receiving space, the shaft body is received in the receiving part, the sidewalls are spaced apart from each other, and every two adjacent sidewalls define a corresponding one of the at least two position-limiting slots therebetween.

9. The support structure of claim 8, wherein the plurality of sidewalls comprises four sidewalls, the at least two position-limiting slots are four position-limiting slots defined by the four sidewalls, two of the position-limiting slots are opposite to each other, and the other two position-limiting slots are opposite to each other, with the locations of the four position-limiting slots creating location angles of 0°, 90°, 180°, and 270°, the shaft further comprises a second position-limiting element, the first position-limiting element and the second position-limiting element are both protrusions and are opposite to each other, and the first and second position-limiting elements are received in two selected opposite position-limiting slots.

10. The support structure of claim 9, wherein the holding mechanism further comprises a protrusion positioned on the holding portion, the connecting portion is positioned on the protrusion, the at least one locking member is formed on the protrusion, the holding portion at the protrusion defines a third receiving space having an opening facing towards the side of the holding portion holding the electronic device, a ring is positioned in the third receiving space, the ring defines a fourth receiving space therein, the fourth receiving space communicates with the second receiving space and in cooperation with the second receiving space has the shaft body received therein, and the elastic element is sleeved over the ring.

11. An electronic device, comprising:
  a main body; and
  a support structure holding the main body, the support structure comprising:
    a stand, comprising a support body, a shaft, and a first position-limiting element, the shaft connected to a first end of the support body; and
    a holding mechanism, comprising:
      a holding portion configured to hold at least a portion of the electronic device; and
      a connecting portion positioned on the holding portion, and receiving the shaft and being rotatable around the shaft, the connecting portion comprising at least two position-limiting slots;
    wherein a second end of the support body is configured to rest on an external surface so as to support the main body above the external surface, the connecting portion is rotatable in unison with rotation of the holding portion, with the connecting portion thereby rotating around the shaft, and the connecting portion stops rotating around the shaft when the first position-limiting element reaches and is received and engaged in one of the at least two position-limiting slots.

12. The electronic device of claim 11, wherein the holding portion holds the main body in different predetermined orientations stably when the first position-limiting element is received in and engaged in different position-limiting slots, the shaft comprises a shaft body and at least one shaft housing, the first position-limiting element is positioned between the shaft body and the at least one shaft housing, the first position-limiting element and the shaft body protrude from the at least one shaft housing, the shaft body is received in the connecting portion with the connecting portion rotatably around the shaft body, and the at least one shaft housing is connected to the first end of the support body.

13. The electronic device of claim 12, further comprising at least one pivot, wherein the first end of the stand comprises a plurality of shaft holes, the at least one pivot extends through the plurality of shaft holes and the at least one shaft housing, and thus the support body and the shaft are hinged together.

14. The electronic device of claim 13, further comprising an elastic fastening element, wherein the elastic fastening element is received in the connecting portion and is held between the shaft body and the holding portion thereby resiliently holding the shaft body in contact with the connecting portion.

15. The electronic device of claim 14, wherein the holding mechanism comprises a holding bracket and a resisting part, the holding bracket comprises two crossing holding bars, each holding bar comprises two opposite free ends, each free end is in the form of a hook, the four free ends of the holding bracket are configured to hook and hold four corners of the electronic device, and the resisting part is configured to resiliently hold a middle portion of a rear side of the electronic device.

16. The electronic device of claim 15, wherein the resisting part and the connecting portion are positioned on two opposite sides of the holding portion, and the resisting part comprises an elastic element configured to resiliently urge the electronic device.

17. The electronic device of claim 16, wherein the holding mechanism further comprises at least one locking member positioned on the holding portion, the resisting part further comprises a resisting element and at least one hooking element, the at least one hooking element is positioned on the resisting element, the resisting element and the at least one hooking element cooperatively define a first receiving space therebetween, the at least one hooking element is inserted into and engaged with the at least one locking member, the elastic element is received in the first receiving space, and the resisting element resiliently holds the middle portion of the rear side of the electronic device under the urging of the elastic element.

18. The electronic device of claim 17, wherein the connecting portion further comprises a receiving part comprising a plurality of sidewalls and a second receiving space cooperatively surrounded by the plurality of sidewalls, the sidewalls each have a curved surface coinciding with the surface of a single common imaginary sphere, adjacent end portions of the sidewalls cooperatively define an opening of the second receiving space, the shaft body is received in the receiving part, the sidewalls are spaced apart from each other, and every two adjacent sidewalls define a corresponding one of the at least two position-limiting slots therebetween.

19. The electronic device of claim 18, wherein the plurality of sidewalls comprises four sidewalls, and the at least two position-limiting slots are four position-limiting slots defined by the four sidewalls, two of the position-limiting slots are opposite to each other, and the other two position-limiting slots are opposite to each other, with the locations of the four position-limiting slots creating location angles of 0°, 90°, 180°, and 270°, the shaft further comprises a second position-limiting element, the first position-limiting element and the second position-limiting element are both protrusions and are opposite to each other, and the first and second position-limiting elements are received in two selected opposite position-limiting slots.

20. The electronic device of claim 19, wherein the holding mechanism further comprises a protrusion positioned on the holding portion, the connecting portion is positioned on the protrusion, the at least one locking member is formed on the protrusion, the holding portion at the protrusion defines a third receiving space having an opening facing towards the side of the holding portion holding the main body, a ring is positioned in the third receiving space, the ring defines a fourth receiving space therein, the fourth receiving space communicates with the second receiving space and in cooperation with the second receiving space has the shaft body received therein, and the elastic element is sleeved over the ring.

\* \* \* \* \*